United States Patent
Ko et al.

(10) Patent No.: US 10,224,303 B2
(45) Date of Patent: Mar. 5, 2019

(54) COMPOSITION FOR ANISOTROPIC CONDUCTIVE FILM, ANISOTROPIC CONDUCTIVE FILM, AND CONNECTION STRUCTURE USING THE SAME

(71) Applicant: SAMSUNG SDI CO., LTD., Yongin-si, Gyeonggi-do (KR)

(72) Inventors: Youn Jo Ko, Suwon-si (KR); Soon Young Kwon, Suwon-si (KR); Ji Yeon Kim, Suwon-si (KR); Ha Na Kim, Suwon-si (KR); Young Woo Park, Suwon-si (KR); Hyun Joo Seo, Suwon-si (KR); Gun Young Heo, Suwon-si (KR); Ja Young Hwang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 70 days.

(21) Appl. No.: 15/369,929

(22) Filed: Dec. 6, 2016

(65) Prior Publication Data

US 2017/0162531 A1     Jun. 8, 2017

(30) Foreign Application Priority Data

Dec. 7, 2015    (KR) .......................... 10-2015-0173398

(51) Int. Cl.
*H01B 1/24* (2006.01)
*C09J 9/00* (2006.01)
(Continued)

(52) U.S. Cl.
CPC ................ *H01L 24/29* (2013.01); *C08J 5/18* (2013.01); *H01B 1/20* (2013.01); *H01B 1/24* (2013.01);
(Continued)

(58) Field of Classification Search
CPC .. H01B 1/12; H01B 1/24; B32B 27/00; B32B 27/38; C08L 63/00; C09J 9/02
See application file for complete search history.

(56) References Cited

U.S. PATENT DOCUMENTS

| | | | | |
|---|---|---|---|---|
| 2006/0110600 | A1* | 5/2006 | Connell | C09J 9/02 428/414 |
| 2007/0134440 | A1* | 6/2007 | Kato | C09K 19/3411 428/1.1 |
| 2014/0329926 | A1* | 11/2014 | Kirino | C08G 59/66 522/14 |

FOREIGN PATENT DOCUMENTS

| | | |
|---|---|---|
| CN | 102597044 A | 7/2012 |
| CN | 104541333 A | 4/2015 |
| JP | 2012-171980 A | 9/2012 |

OTHER PUBLICATIONS

Office Action dated Nov. 21, 2017 in the corresponding Taiwanese Patent Application No. 105140285.

* cited by examiner

*Primary Examiner* — Mark Kopec
(74) *Attorney, Agent, or Firm* — Lee & Morse, P.C.

(57) ABSTRACT

An anisotropic conductive film composition, an anisotropic conductive film prepared using the same, and a connection structure using the same, the anisotropic conductive film including a binder resin; a curable alicyclic epoxy compound; a curable oxetane compound; a quaternary ammonium catalyst; and conductive particles, wherein the anisotropic conductive film has a heat quantity variation rate of about 15% or less, as measured by differential scanning calorimetry (DSC) and calculated by Equation 1:

Heat quantity variation rate (%)=$[(H_0-H_1)/H_0] \times 100$     Equation 1 wherein $H_0$ is a DSC heat quantity of the anisotropic conductive film, as measured at 25° C. and a time point (Continued)

of 0 hr, and $H_1$ is a DSC heat quantity of the anisotropic conductive film, as measured after being left at 40° C. for 24 hours.

15 Claims, 1 Drawing Sheet

(51) Int. Cl.
    *H01L 23/00*     (2006.01)
    *C08J 5/18*     (2006.01)
    *H01B 1/20*     (2006.01)

(52) U.S. Cl.
CPC ........... *H01L 24/32* (2013.01); *C08J 2371/10* (2013.01); *C08J 2463/00* (2013.01); *C08J 2471/02* (2013.01); *H01L 2224/2929* (2013.01); *H01L 2224/29339* (2013.01); *H01L 2224/29344* (2013.01); *H01L 2224/29347* (2013.01); *H01L 2224/29355* (2013.01); *H01L 2224/29387* (2013.01); *H01L 2224/32145* (2013.01); *H01L 2224/32225* (2013.01); *H01L 2924/0102* (2013.01); *H01L 2924/0103* (2013.01); *H01L 2924/01005* (2013.01); *H01L 2924/01012* (2013.01); *H01L 2924/01013* (2013.01); *H01L 2924/01058* (2013.01); *H01L 2924/04941* (2013.01); *H01L 2924/0503* (2013.01); *H01L 2924/059* (2013.01); *H01L 2924/0532* (2013.01); *H01L 2924/0542* (2013.01); *H01L 2924/05042* (2013.01); *H01L 2924/05341* (2013.01); *H01L 2924/05342* (2013.01); *H01L 2924/05381* (2013.01); *H01L 2924/05432* (2013.01); *H01L 2924/05442* (2013.01); *H01L 2924/066* (2013.01); *H01L 2924/069* (2013.01); *H01L 2924/0615* (2013.01); *H01L 2924/0635* (2013.01); *H01L 2924/0665* (2013.01); *H01L 2924/0675* (2013.01); *H01L 2924/0695* (2013.01); *H01L 2924/07025* (2013.01)

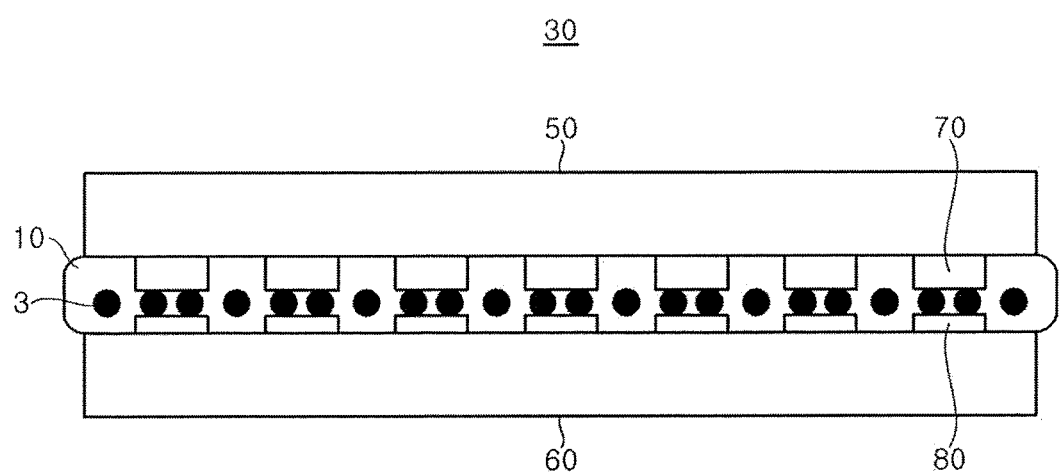

COMPOSITION FOR ANISOTROPIC CONDUCTIVE FILM, ANISOTROPIC CONDUCTIVE FILM, AND CONNECTION STRUCTURE USING THE SAME

CROSS-REFERENCE TO RELATED APPLICATION

Korean Patent Application No. 10-2015-0173398, filed on Dec. 7, 2015, in the Korean Intellectual Property Office, and entitled: "Composition for Use of Anisotropic Conductive Film, Anisotropic Conductive Film, and Connection Structure Using the Same," is incorporated by reference herein in its entirety.

BACKGROUND

1. Field

Embodiments relate to a composition for an anisotropic conductive film, an anisotropic conductive film, and a connection structure using the same.

2. Description of the Related Art

An anisotropic conductive film (ACF) may refer to a film-type adhesive prepared by dispersing conductive particles in a resin such as an epoxy resin and may be formed of an anisotropic adhesive polymer film which exhibits conductive properties in the thickness direction of the film and insulating properties in the surface (orthogonal) direction thereof.

When an anisotropic conductive film between circuit boards to be connected is subjected to heating/compression under specific conditions, overlapping circuit terminals of the circuit boards may be electrically connected to one another through conductive particles. In addition, spaces between adjacent electrodes may be filled with an insulating adhesive resin to isolate the conductive particles from one another, such that adjacent electrodes may be be electrically insulated from one another.

Such an anisotropic conductive film may be used to attach a drive IC to a glass substrate in manufacture of a flat panel display such as a liquid crystal display and an organic light emitting diode display.

SUMMARY

Embodiments are directed to a composition for an anisotropic conductive film, an anisotropic conductive film, and a connection structure using the same.

The embodiments may be realized by providing an anisotropic conductive film including a binder resin; a curable alicyclic epoxy compound; a curable oxetane compound; a quaternary ammonium catalyst; and conductive particles, wherein the anisotropic conductive film has a heat quantity variation rate of about 15% or less, as measured by differential scanning calorimetry (DSC) and calculated by Equation 1:

Heat quantity variation rate (%)=[($H_0$–$H_1$)/$H_0$]×100  Equation 1 wherein $H_0$ is a DSC heat quantity of the anisotropic conductive film, as measured at 25° C. and a time point of 0 hr, and $H_1$ is a DSC heat quantity of the anisotropic conductive film, as measured after being left at 40° C. for 24 hours.

The alicyclic epoxy compound may be represented by one of Formulae 1 to 4:

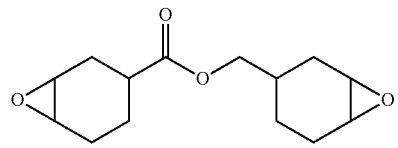

Formula 1

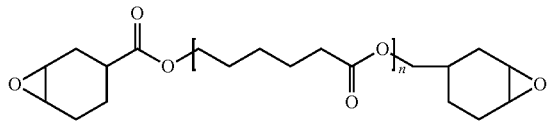

Formula 2

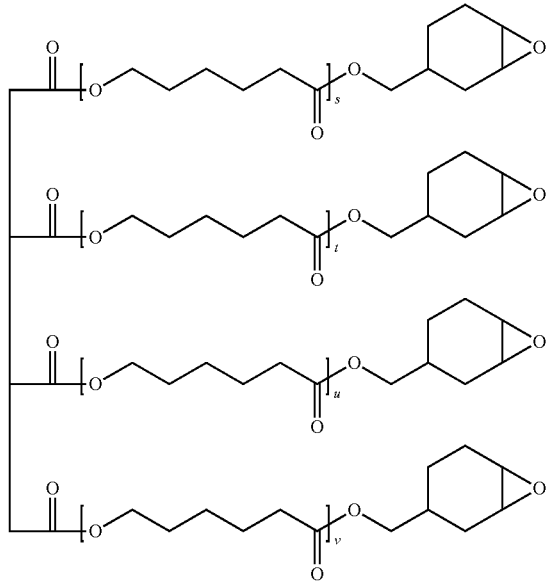

Formula 3

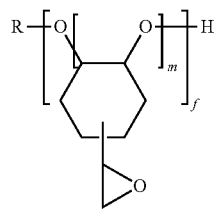

Formula 4 wherein, in Formulae 2 to 4, n, s, t, u, v, m, and f may each independently be an integer of 1 to 50, and R may be an alkyl group, an acetyl group, an alkoxy group, or a carbonyl group.

The oxetane compound may be a carbon polymer compound containing 1 to 4 oxetane rings per molecule.

The quaternary ammonium catalyst may be represented by Formula 26:

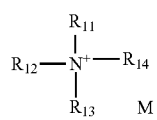

Formula 26 wherein, in Formula 26, $R_{11}$, $R_{12}$, $R_{13}$ and $R_{14}$ may each independently be a substituted or unsubstituted $C_1$ to $C_6$ alkyl group or a substituted or unsubstituted $C_6$ to $C_{20}$ aryl group, and M may be $Cl^-$, $BF_4^-$, $PF_6^-$, $N(CF_3SO_2)_2^{2-}$, $CH_3CO_2^-$, $CF_3CO_2^-$, $CF_3SO_3^-$, $HSO_4^-$, $SO_4^{2-}$, $SbF_6^-$, or $B(C_6F_5)_4^-$.

M may be $SbF_6^-$ or $B(C_6F_5)_4^-$.

The binder resin may include a polyimide resin, a polyamide resin, a phenoxy resin, a polymethacrylate resin, a polyacrylate resin, a polyurethane resin, a polyester resin, a polyester urethane resin, a polyvinyl butyral resin, a styrene-butadiene-styrene (SBS) resin or an epoxylated compound thereof, a styrene-ethylene/butylene-styrene (SEBS) resin or a modified compound thereof, an acrylonitrile butadiene rubber (NBR) or a hydrogenated compound thereof, or a combination thereof.

The binder resin may include the phenoxy resin, the phenoxy resin including a fluorene phenoxy resin.

The anisotropic conductive film may further include an inorganic filler, the inorganic filler including alumina, silica, titania, zirconia, magnesia, ceria, zinc oxide, iron oxide, silicon nitride, titanium nitride, boron nitride, calcium carbonate, aluminum sulfate, aluminum hydroxide, calcium titanate, talc, calcium silicate, or magnesium silicate.

The anisotropic conductive film may include about 20 wt % to 60 wt % of the binder resin; a total of about 10 wt % to about 40 wt % of the curable alicyclic epoxy compound and the curable oxetane compound; about 1 wt % to about 10 wt % of the quaternary ammonium catalyst; about 5 wt % to about 30 wt % of the inorganic filler; and about 1 wt % to about 20 wt % of the conductive particles, based on a total weight of the anisotropic conductive film in terms of solid content.

A weight ratio of the alicyclic epoxy compound to the oxetane compound may be about 1:9 to about 9:1.

The anisotropic conductive film may further include a stabilizer in an amount of greater than 0 wt % to less than 5 wt %, based on a total weight of the anisotropic conductive film in terms of solid content.

The anisotropic conductive film may further include a curable epoxy group-containing silsesquioxane compound, a curable oxetane group-containing silsesquioxane compound, a curable phenol novolac epoxy resin, or a curable cresol novolac epoxy resin.

The anisotropic conductive film may have a DSC exothermic onset temperature of about 70° C. to about 85° C. and a DSC exothermic peak temperature of about 90° C. to about 110° C.

The anisotropic conductive film may have a post-reliability connection resistance of about 0.5Ω or less, as measured after preliminary compression at a temperature of 50° C. to 90° C. under a pressure of 0.5 MPa to 2 MPa for 0.5 to 2 seconds and main compression at a temperature of 100° C. to 150° C. under a pressure of 50 MPa to 90 MPa for 4 to 7 seconds, followed by leaving the film at 85° C. and 85% RH for 500 hours.

The embodiments may be realized by providing an anisotropic conductive film composition including a binder resin; a curable alicyclic epoxy compound; a curable oxetane compound; a quaternary ammonium catalyst; and conductive particles.

The embodiments may be realized by providing a connection structure including a first connection member that includes a first electrode; a second connection member that includes a second electrode; and an anisotropic conductive film between the first connection member and the second connection member to connect the first electrode to the second electrode, wherein the anisotropic conductive film is the anisotropic conductive film according to an embodiment.

The embodiments may be realized by providing a connection structure including a first connection member that includes a first electrode; a second connection member that includes a second electrode; and an anisotropic conductive film between the first connection member and the second connection member to connect the first electrode to the second electrode, wherein the anisotropic conductive film is prepared using the anisotropic conductive film composition according to an embodiment.

BRIEF DESCRIPTION OF THE DRAWING

Features will be apparent to those of skill in the art by describing in detail exemplary embodiments with reference to the attached drawing in which:

FIG. 1 illustrates a sectional view of a connection structure according to one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments will be described in detail. Descriptions of details apparent to those skilled in the art will be omitted herein.

An embodiment relates to an anisotropic conductive film composition including a binder resin, curable compounds including an alicyclic epoxy compound and an oxetane compound, a quaternary ammonium catalyst, and conductive particles.

Binder Resin

Examples of the binder resin may include a polyimide resin, a polyamide resin, a phenoxy resin, a polymethacrylate resin, a polyacrylate resin, a polyurethane resin, a polyester resin, a polyester urethane resin, a polyvinyl butyral resin, a styrene-butadiene-styrene (SBS) resin or epoxylated compounds thereof, a styrene-ethylene/butylene-styrene (SEBS) resin or modified compounds thereof, an acrylonitrile butadiene rubber (NBR) or hydrogenated compounds thereof, and combinations thereof. In an implementation, the binder resin may include, e.g., a phenoxy resin. In an implementation, the binder resin may include, e.g., a fluorene phenoxy resin. As the fluorene phenoxy resin, a suitable phenoxy resin containing a fluorene structure may be used.

The binder resin may be present in an amount of, e.g., about 20 wt % to about 60 wt % based on a total weight of the anisotropic conductive film composition in terms of solid content. In an implementation, the binder resin may be present in an amount of about 25 wt % to about 40 wt %, e.g., 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, or 40 wt %, based on the total weight of the anisotropic conductive film composition in terms of solid content.

Alicyclic Epoxy Compound

The anisotropic conductive film composition may include the alicyclic epoxy compound (e.g., curable alicyclic epoxy compound) as one of the curable compounds. The alicyclic epoxy compound may have an epoxy structure present near an aliphatic ring, and the alicyclic epoxy compound may facilitate a rapid ring opening reaction and thus may exhibit better curing reactivity than other epoxy compounds. As the alicyclic epoxy compound, a suitable alicyclic epoxy compound including the epoxy structure directly coupled to the aliphatic ring or coupled thereto through another linking site may be used. In an implementation, the anisotropic conductive film composition may include an alicyclic epoxy compound represented by one of the following Formulae 1 to 4.

[Formula 1]

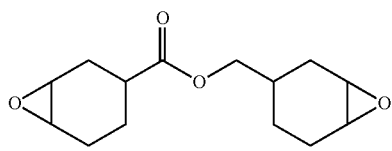

[Formula 2]

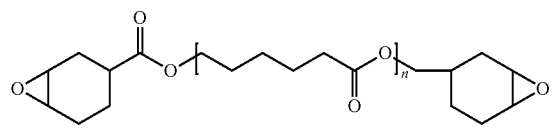

[Formula 3]

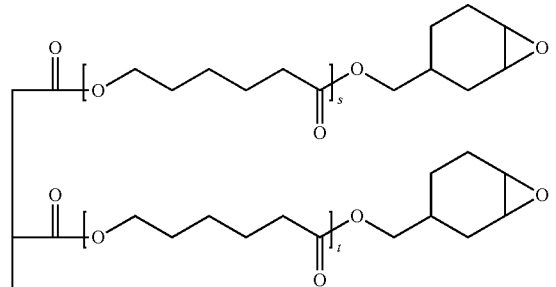

[Formula 4]

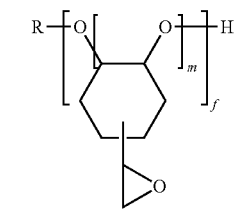

In Formula 2 to 4, n, s, t, u, v, m, and f may be each independently an integer of 1 to 50, and R may be an alkyl group, an acetyl group, an alkoxy group, or a carbonyl group. In an implementation, n, s, t, u, v, m, and f may be each independently an integer of 1 to 25, and R may be an alkyl group, an acetyl group, or an alkoxy group.

In an implementation, a single curable alicyclic epoxy compound may be used alone or multiple, different curable alicyclic epoxy compounds may be used.

Oxetane Compound

The anisotropic conductive film composition may include the oxetane compound (e.g., curable oxetane compound) as the curable compound, in addition to the alicyclic epoxy compound. As used herein, the oxetane compound refers to a carbon-based compound containing an oxetane ring. The oxetane compound may have good curing reactivity due to a ring-opening reaction of the oxetane ring. In an implementation, an oxetane compound containing 1 to 4 oxetane rings per molecule may be used to help suppress cracking of the composition after curing. In an implementation, an oxetane compound containing one oxetane ring may be represented by the following Formula 5.

Formula 5

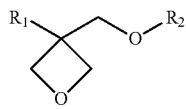

In Formula 5, $R_1$ may be, e.g., a hydrogen atom, a $C_1$ to $C_6$ alkyl group (such as a methyl group, an ethyl group, a propyl group, or a butyl group), a $C_1$ to $C_6$ fluoroalkyl group, an allyl group, an aryl group, a furyl group, or a thienyl group. $R_2$ may be, e.g., a $C_1$ to $C_6$ alkyl group (such as a methyl group, an ethyl group, a propyl group, or a butyl group), a $C_2$ to $C_6$ alkenyl group (such as a 1-propenyl group, a 2-propenyl group, a 2-methyl-1-propenyl group, a 2-methyl-2-propenyl group, a 1-butenyl group, a 2-butenyl group, or a 3-butenyl group), an aromatic ring-containing group (such as a phenyl group, a benzyl group, a fluorobenzyl group, a methoxybenzyl group, or a phenoxyethyl group), a $C_2$ to $C_6$ alkylcarbonyl group (such as an ethylcarbonyl group, a propylcarbonyl group, or a butylcarbonyl group), a C2 to C6 alkoxycarbonyl group (such as an ethoxycarbonyl group, a propoxycarbonyl group, or a butoxycarbonyl group), or a $C_2$ to $C_6$ N-alkylcarbamoyl group (such as an ethylcarbamoyl group, a propylcarbamoyl group, a butylcarbamoyl group, or a pentylcarbamoyl group).

In an implementation, an oxetane compound containing two oxetane rings may be represented by the following Formula 6.

Formula 6

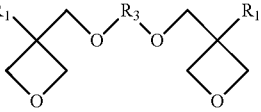

In Formula 6, $R_1$ may be the same as $R_1$ in Formula 5. $R_3$ may be selected from, e.g., a linear or branched alkylene group (such as an ethylene group, a propylene group, or a butylene group), a linear or branched poly(alkyleneoxy) group, a linear or branched unsaturated hydrocarbon group (such as a propenylene group, a methylpropenylene group, or a butenylene group), a carbonyl group, a carbonyl group-containing alkylene group, a carboxyl group-containing alkylene group, a carbamoyl group-containing alkylene group, or a functional group represented by the following Formulae 7 to 19.

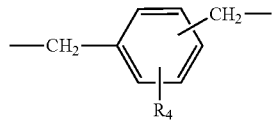

Formula 7

In Formula 7, $R_4$ may be, e.g., a hydrogen atom, a $C_1$ to $C_4$ alkyl group such as a methyl group, an ethyl group, a propyl group or a butyl group, a $C_1$ to $C_4$ alkoxy group such as a methoxy group, an ethoxy group, a propoxy group, or a butoxy group, a halogen atom such as a chlorine atom or bromine atom, a nitro group, a cyano group, a mercapto group, a lower alkylcarboxyl group, a carboxyl group, or a carbamoyl group.

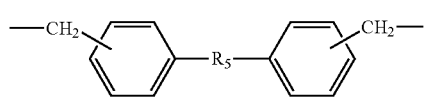

Formula 8

In Formula 8, $R_5$ may be, e.g., an oxygen atom, a sulfur atom, a methylene group, an amine group, a sulfonyl group, a bis(trifluoromethyl)methylene group, or a dimethyl methylene group.

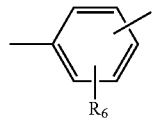

Formula 9

In Formula 9, $R_6$ may be, e.g., a hydrogen atom, a $C_1$ to $C_4$ alkyl group such as a methyl group, an ethyl group, a propyl group or a butyl group, a $C_1$ to $C_4$ alkoxy group such as a methoxy group, an ethoxy group, a propoxy group, or a butoxy group, a halogen atom such as a chlorine atom or bromine atom, a nitro group, a cyano group, a mercapto group, a lower alkylcarboxyl group, a carboxyl group, or a carbamoyl group.

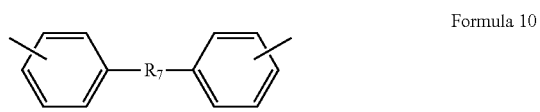

Formula 10

In Formula 10, $R_7$ may be, e.g., an oxygen atom, a sulfur atom, a methylene group, an amine group, a sulfonyl group, a bis(trifluoromethyl)methylene group, a dimethyl methylene group, a phenylmethylmethylene group, or a diphenylmethylene group.

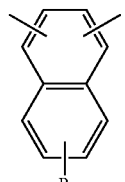

Formula 11

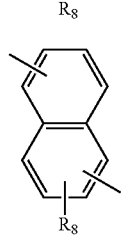

Formula 12

In Formulae 11 and 12, $R_8$ may be, e.g., a hydrogen atom, a $C_1$ to $C_4$ alkyl group such as a methyl group, an ethyl group, a propyl group or a butyl group, a $C_1$ to $C_4$ alkoxy group such as a methoxy group, an ethoxy group, a propoxy group, or a butoxy group, a halogen atom such as a chlorine atom or bromine atom, a nitro group, a cyano group, a mercapto group, a lower alkylcarboxyl group, a carboxyl group, or a carbamoyl group. In an implementation, $R_8$ may also include 2 to 4 substituents substituted in a naphthalene ring.

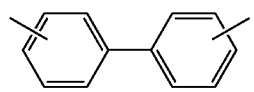

Formula 13

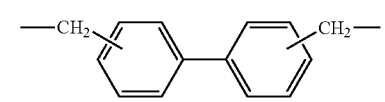

Formula 14

Formula 15

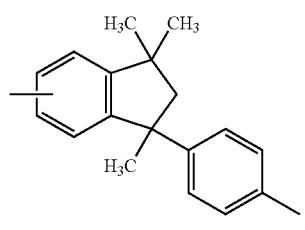

Formula 16

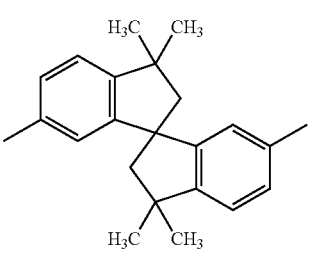

-continued

Formula 17

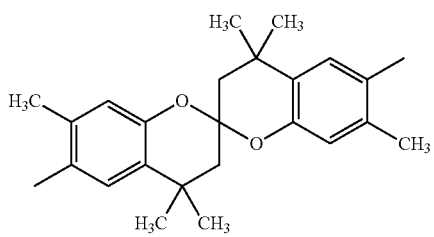

Formula 18

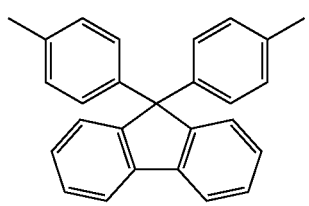

Formula 19

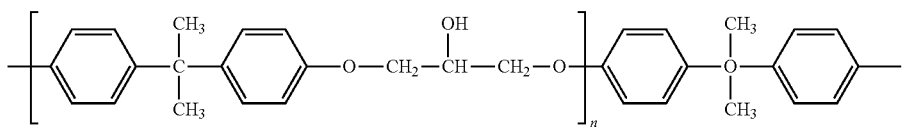

In Formula 19, n may range from 0 to 10.

In an implementation, the oxetane compound containing two oxetane rings may be a mixture of compounds represented by Formula 19 and having different values of n.

In an implementation, the oxetane compound containing two oxetane rings may be a compound represented by Formula 20.

Formula 20

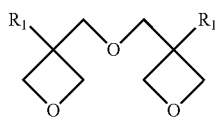

In Formula 20, $R_1$ may be the same as $R_1$ in Formula 5.

In an implementation, an oxetane compound containing 3 to 4 oxetane rings may be a compound represented by the following Formula 21.

Formula 21

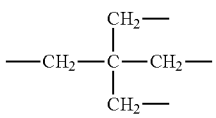

In Formula 21, $R_1$ may be the same as $R_1$ in Formula 5, and m may be, g . . . , 3 or 4. $R_9$ may be, e.g., a $C_1$ to $C_{12}$ branched alkylene group such as groups represented by Formula 22, Formula 23, and Formula 24, or a branched poly(alkyleneoxy) group represented by Formula 25.

Formula 22

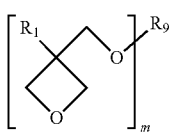

In Formula 22, $R_{10}$ may be, e.g., a lower alkyl group such as a methyl group, an ethyl group, or a propyl group.

Formula 23

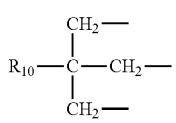

Formula 24

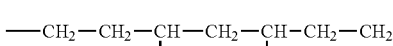

Formula 25

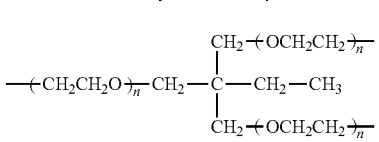

In Formula 25, n may be an integer of 1 to 10.

In an implementation, the above oxetane compounds may be used alone or in combination thereof.

The anisotropic conductive film composition including the alicyclic epoxy compound and the oxetane compound as the curable compounds may achieve rapid curing at low temperature due to high reactivity of the compounds. In an implementation, the curable compounds (including the alicyclic epoxy compound and the oxetane compound) may be present in an amount of about 10 wt % to about 40 wt %, e.g., about 15 wt % to about 40 wt %, or 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, or 40 wt %, based on the total weight of the anisotropic conductive film composition in terms of solid content. For example a total amount of the curable alicyclic epoxy compound and the curable oxetane compound may be within the amounts described above. In an implementation, a weight ratio of the alicyclic epoxy compound to the oxetane compound may be, e.g., about 1:9 to about 9:1.

Other Curable Compound

In an implementation, the anisotropic conductive film composition may further include an additional curable compound together with the alicyclic epoxy compound and the oxetane compound. In an implementation, the additional curable compound may include, e.g., an epoxy group-containing silsesquioxane compound, an oxetane group-containing silsesquioxane compound, a phenol novolac epoxy compound, and a cresol novolac epoxy compound. An epoxy group or oxetane group-containing silsesquioxane compound may have a polyhedral oligomeric silsesquioxane (POS) structure, a random structure, a ladder structure, or a partial cage structure.

When such a multifunctional group-containing curable compound is further included in the composition, it is possible to help improve a particle capture rate while preventing volume expansion of the anisotropic conductive film after reliability testing at high temperature and high humidity.

Quaternary Ammonium Catalyst

The anisotropic conductive film composition may include a quaternary ammonium catalyst. In an implementation, as the quaternary ammonium catalyst, a compound represented by Formula 26 may be used.

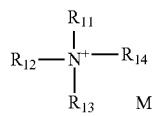

Formula 26

In Formula 26, $R_{11}$, $R_{12}$, $R_{13}$, and $R_{14}$ may each independently be or include, e.g., a substituted or unsubstituted $C_1$ to $C_6$ alkyl group or a substituted or unsubstituted $C_6$ to $C_{20}$ aryl group. In an implementation, M may be, e.g., $Cl^-$, $BF_4^-$, $PF_6^-$, $N(CF_3SO_2)_2^{2-}$, $CH_3CO_2^-$, $CF_3CO_2^-$, $CF_3SO_3^-$, $HSO_4^-$, $SO_4^{2-}$, $SbF_6^-$, or $B(C_6F_5)_4^-$. In Formula 26, a number of quaternary ammonium moieties may be adjusted in order to provide a neutral charge, e.g., depending on the charge provided by M.

In an implementation, $R_{11}$, $R_{12}$, $R_{13}$, and $R_{14}$ may each independently be or include, e.g., a methyl group, an ethyl group, a propyl group, an isopropyl group, a butyl group, a isobutyl group, an s-butyl group, a t-butyl group, a pentyl group, an n-pentyl group, a t-pentyl group, an isopentyl group, a hexyl group, a cyclohexyl group, a phenyl group, an anthryl group, or a phenanthryl group. As used herein, the term "substituted" means that a hydrogen atom in a compound is substituted or replaced with a substituent selected from, e.g., an alkyl group, an alkoxy group, an amino group, a halogen atom, and a nitro group.

The quaternary ammonium catalyst may help promote a ring opening reaction of the alicyclic epoxy compound at a specific temperature, and thus may facilitate the alicyclic epoxy compound and the oxetane compound to be rapidly cured at a temperature of 150° C. or less. Further, the quaternary ammonium catalyst may exhibit lower reactivity at a temperature lower than the curing temperature, e.g., at room or ambient temperature, than sulfonium-based cationic catalysts, which are generally used as a cationic catalyst, and thus may help delay a ring opening reaction of the alicyclic epoxy compound, thereby providing excellent storage stability.

In an implementation, in Formula 26, M may be, e.g., $SbF_6^-$ or $B(C_6F_5)_4^-$. In an implementation, M may be, e.g., $B(C_6F_5)_4^-$, in view of eco-friendliness.

When the quaternary ammonium compound catalyst is used together with the alicyclic epoxy compound and the oxetane compound, it is possible to reduce a difference between exothermic onset temperature and exothermic peak temperature of the anisotropic conductive film composition, as measured by differential scanning calorimetry (DSC), thereby facilitating rapid curing of the composition.

In an implementation, the quaternary ammonium catalyst may be present in an amount of about 1 wt % to about 10 wt %, e.g., 1 wt %, 2 wt %, 3 wt %, 4 wt %, 5 wt %, 6 wt %, 7 wt %, 8 wt %, 9 wt %, or 10 wt %, based on the total weight of the anisotropic conductive film composition in terms of solid content.

Stabilizer

In an implementation, the anisotropic conductive film composition may include a stabilizer to help adjust a curing temperature of the composition. The stabilizer may help delay a ring opening reaction of the alicyclic epoxy compound, thereby adjusting the curing temperature.

In an implementation, a compound represented by Formula 27 may be used as the stabilizer.

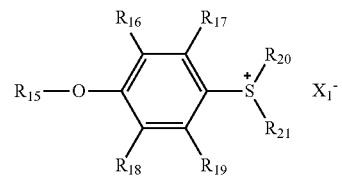

Formula 27

In Formula 27, $R_{15}$ to $R_{19}$ may each independently be, e.g., a hydrogen atom, an alkyl group, an acetyl group, an alkoxy carbonyl group, a benzoyl group, or a benzyloxycarbonyl group, $R_{20}$ and $R_{21}$ may each independently be, e.g., an alkyl group, a benzyl group, an o-methyl benzyl group, an m-methylbenzyl group, a p-methylbenzyl group, or a naphthylmethyl group, and $X_1$ may be, e.g., alkyl sulfuric acid.

In an implementation, the stabilizer may be used in a small quantity, e.g., the stabilizer may be used just for fine adjustment of the curing temperature. In an implementation, the stabilizer may be included in the anisotropic conductive film composition in an amount of less than 5 wt %, e.g., more than 0 wt % to less than 5 wt %, or 1 wt %, 2 wt %, 3 wt %, or 4 wt %, based on the weight of the quaternary ammonium catalyst.

Conductive Particles

The conductive particles may be selected from suitable conductive particles. Examples of the conductive particles may include: metal particles including Au, Ag, Ni, Cu, and solders; carbon particles; particles obtained by coating polymer resin particles, such as polyethylene, polypropylene, polyester, polystyrene, polyvinyl alcohol and modified resins thereof, with a metal including Au, Ag, Ni, and the like; and insulated particles obtained through insulation treatment of surfaces of the particles obtained by coating the polymer resin particles with the metal. The conductive particles may have a particle size of, for example, about 1 μm to about 20 μm, e.g. about 1 μm to about 10 μm, for example, 1 μm, 2 μm, 3 μm, 4 μm, 5 μm, 6 μm, 7 μm, 8 μm, 9 μm, or 10 μm, depending upon a pitch of circuits.

In an implementation, the conductive particles may be present in an amount of about 1 wt % to 20 wt % based on the total weight of the anisotropic conductive film in terms of solid content.

When the anisotropic conductive film has a double-layer structure of a conductive layer and a dielectric layer and is used for connection between a glass substrate and an IC, the conductive particles may be present in an amount of about 10 wt % to about 50 wt %, e.g. about 15 wt % to about 35 wt %, or 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, or 35 wt %, based on the weight of the conductive layer in terms of solid content. In an implementation, the amount of the conductive particles may vary depending on the area of an electrode of a circuit to be connected and the desired number of the particles on the electrode. Within this range, the conductive particles may be easily compressed between terminals to secure stable connection reliability while reducing connection resistance through improvement in electrical conductivity.

Inorganic Filler

The inorganic filler included in the film composition may be selected from suitable inorganic fillers. Examples of the inorganic filler may include alumina, silica, titania, zirconia, magnesia, ceria, zinc oxide, iron oxide, silicon nitride, titanium nitride, boron nitride, calcium carbonate, aluminum sulfate, aluminum hydroxide, calcium titanate, talc, calcium silicate, and magnesium silicate. In an implementation, the inorganic filler may include, e.g., alumina, silica, calcium carbonate, or aluminum hydroxide. In an implementation, the inorganic fillers may be aluminum hydroxide or silica. In an implementation, aluminum hydroxide may help improve coatability of the anisotropic conductive film composition, adjust fluidity of the film composition, and prevent corrosion of an adherend.

The inorganic fillers may be present in an amount of about 5 wt % to about 30 wt %, e.g., 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, based on the total weight of the anisotropic conductive film composition in terms of solid content. Within this range, the inorganic fillers can effectively disperse the conductive particles and can suitably adjust fluidity of the anisotropic conductive film.

Other Additives

In an implementation, the anisotropic conductive film composition may further include a silane coupling agent. The silane coupling agent may include, e.g., polymerizable fluorine group-containing silicon compounds, such as vinyltrimethoxysilane, vinyltriethoxysilane, and (meth)acryloxypropyltrimethoxysilane; epoxy group-containing silicon compounds, such as 3-glycidoxypropyltrimethoxysilane, 3-glycidoxypropylmethyldimethoxysilane, and 2-(3,4-epoxycyclohexyl)-ethyltrimethoxysilane; amino group-containing silicon compounds, such as 3-aminopropyltrimethoxysilane, N-(2-aminoethyl)-3-aminopropyltrimethoxysilane, and N-(2-aminoethyl)-3-aminopropylmethyldimethoxysilane; and 3-chloropropyltrimethoxysilane.

The silane coupling agent may be present in an amount of about 0 wt % to about 10 wt %, e.g., 1 wt %, 2 wt %, 3 wt %, 4 wt %, 5 wt %, 6 wt %, 7 wt %, 8 wt %, 9 wt %, or 10 wt %, based on the total weight of the anisotropic conductive film composition in terms of solid content.

In an implementation, the anisotropic conductive film composition may further include additives such as a polymerization inhibitor, an antioxidant, and a heat stabilizer to provide additional properties without affecting basic properties thereof. The additives may be present in an amount of about 0.01 wt % to about 2 wt %, e.g., 0.01 wt %, 0.05 wt %, 0.1 wt %, 0.5 wt %, 1.5 wt %, or 2 wt %, based on the total weight of the anisotropic conductive film composition in terms of solid content.

Examples of the polymerization inhibitor may include hydroquinone, hydroquinone monomethyl ether, p-benzoquinone, phenothiazine, and mixtures thereof, without being limited thereto. The antioxidant may be a phenolic or hydroxycinnamate antioxidant. For example, the antioxidant may include tetrakis[methylene(3,5-di-t-butyl-4-hydroxycinnamate)]methane, 3,5-bis(1,1-dimethylethyl)-4-hydroxybenzenepropanoic acid thiodi-2,1-ethanediyl ester, and the like.

Another embodiment relates to an anisotropic conductive film including a binder resin, curable compounds including an alicyclic epoxy compound and an oxetane compound, a quaternary ammonium catalyst, and conductive particles and having a heat quantity variation rate of 15% or less, as measured by differential scanning calorimetry (DSC) and calculated by Equation 1.

Heat quantity variation rate (%)=$[(H_0-H_1)/H_0]\times 100$    Equation 1

In Equation 1, $H_0$ is DSC heat quantity of the anisotropic conductive film, as measured immediately after manufacture thereof, for example, as measured at 25° C. and a time point of 0 hr, and $H_1$ is DSC heat quantity of the anisotropic conductive film, as measured after being left at 40° C. for 24 hours.

The binder resin, the curable compound including the alicyclic epoxy compound and the oxetane compound, and the quaternary ammonium catalyst are the same as those of the anisotropic conductive film composition.

In an implementation, the anisotropic conductive film may further include conductive particles, an additional curable compound, and the like, as described above.

In an implementation, the anisotropic conductive film may further include a stabilizer, as described above. The stabilizer may be present in an amount of more than 0 wt % to less than 5 wt %, e.g., 1 wt %, 2 wt %, 3 wt %, 4 wt %, based on the total weight of the anisotropic conductive film in terms of solid content.

Heat Quantity Variation Rate

The anisotropic conductive film according to an embodiment may have a heat quantity variation rate of 15% or less, e.g. 10% or less, as calculated by Equation 1.

Heat quantity variation rate (%)=$[(H_0-H_1)/H_0]\times 100$

In Equation 1, $H_0$ is DSC heat quantity of the anisotropic conductive film, as measured at 25° C. and a time point of 0 hr, and $H_1$ is DSC heat quantity of the anisotropic conductive film, as measured after being left at 40° C. for 24 hours.

DSC heat quantity of the anisotropic conductive film may be measured by a suitable method. For example, the DSC heat quantity of the anisotropic conductive film may be calculated based on calories of the anisotropic conductive film depending on temperature, as measured while heating the film in a temperature range of −50° C. to 250° C. at a heating rate of 10° C./min using a DSC (differential scanning calorimeter) (Q20, TA Instruments) under a nitrogen atmosphere. Within the above range of heat quantity variation rate, the anisotropic conductive film may have good storage stability.

DSC Exothermic Onset Temperature and DSC Exothermic Peak Temperature

The anisotropic conductive film according to an embodiment may have a DSC exothermic onset temperature of about 70° C. to about 85° C. and an exothermic peak temperature of about 90° C. to about 110° C.

On a DSC graph, the DSC exothermic onset temperature is defined as a temperature at a time point at which a base line between a heat generation onset point and a heat generation finish point meets a tangential line from the highest peak to a point at which the slope of the DSC graph starts to increase due to heat generation upon DSC measurement. The DSC exothermic peak temperature is defined as a temperature at the highest peak of heat quantity.

For example, the DSC exothermic onset temperature and the DSC exothermic peak temperature may be measured through a process of heating the film composition in a temperature range of −50° C. to 250° C. at a heating rate of 10° C./min using a DSC (differential scanning calorimeter) (Q20, TA Instruments) under a nitrogen atmosphere.

Within the above range of DSC exothermic onset temperature and DSC exothermic peak temperature, the anisotropic conductive film may be be cured at relatively low temperature of 150° C. or less, e.g., about 130° C. to about 150° C., and may be rapidly cured due to a small difference between DSC exothermic onset temperature and DSC exothermic peak temperature.

Post-Reliability Connection Resistance ($T_1$)

The anisotropic conductive film may have a post-reliability connection resistance of about 0.5Ω or less, as measured after preliminary compression at a temperature of 50° C. to 90° C. under a pressure of 0.5 MPa to 2 MPa for 0.5 to 2 seconds and main compression at a temperature of 100° C. to 150° C. under a pressure of 50 MPa to 90 MPa for 4 to 7 seconds, followed by leaving the film at 85° C. and 85% RH for 500 hours.

Within this range of connection resistance after reliability testing, the anisotropic conductive film may exhibit improved properties in terms of connection reliability and long-term storage stability.

The connection resistance after reliability testing may be measured by the following exemplary method. In this method, first, the anisotropic conductive film may be placed on a glass substrate including an ITO circuit having a bump area of 1,200 μm$^2$ and a thickness of 2,000 Å, followed by preliminary compression at a temperature of 50° C. to 90° C. under a pressure of 0.5 MPa to 2 MPa for 0.5 to 2 seconds, and after removal of a release film, an IC chip having a bump area of 1,200 μm$^2$ and a thickness of 1.5 T may be placed on the anisotropic conductive film, followed by main compression at a temperature of 100° C. to 150° C. under a pressure of 50 MPa to 90 MPa for 4 to 7 seconds, thereby preparing a specimen. Then, values of resistance between 4 points of the prepared specimen may be measured using a resistance meter (2000 Multimeter, Keithley Instruments) by the 4 point probe method, thereby finding an initial connection resistance $T_0$. Then, the specimen may be left at 85° C. and 85% RH for 500 hours, followed by measurement of resistance in the same manner, thereby finding a connection resistance after reliability testing $T_1$. Here, the resistance may be are calculated based on voltages measured upon application of a current of 1 mA by the resistance meter, and averaged.

Method of Fabricating Anisotropic Conductive Film

A method of fabricating the anisotropic conductive film does not require any special device or equipment. For example, the anisotropic conductive film composition including the components as set forth above may be dissolved in an organic solvent (such as toluene), followed by stirring for a certain period of time at a stirring speed not causing crushing of the conductive particles. Then, the resulting material is coated onto a release film to a thickness of, e.g., about 10 μm to about 50 μm, and dried for a certain period of time to volatilize toluene and the like, thereby obtaining an anisotropic conductive film.

A further aspect of the embodiments relates to a connection structure including: a first connection member including a first electrode; a second connection member including a second electrode; and an anisotropic conductive film disposed between the first connection member and the second connection member to connect the first electrode to the second electrode, wherein the anisotropic conductive film may be the anisotropic conductive film according to the embodiments.

The first connection member or the second connection member may include an electrode for electrical connection. For example, the first connection member or the second connection member may be a glass or plastic substrate, a printed wiring board, a ceramic wiring board, a flexible wiring board, a semiconductor silicon chip, an integrated circuit (IC) chip, or a driver IC chip, which is formed with an indium tin oxide (ITO) or indium zinc oxide (IZO) electrode for LCDs. For example, one of the first connection member and the second connection member may be an IC chip or a driver IC chip, and the other may be a glass substrate.

Referring to FIG. 1, a connection structure 30 according to one embodiment may include a first connection member 50 including a first electrode 70 and a second connection member 60 including a second electrode 80, wherein the first connection member and the second connection member may be connected to each other via an anisotropic conductive film 10, which may be disposed between the first connection member and the second connection member and may include conductive particles 3 connecting the first electrode to the second electrode, wherein the anisotropic conductive film may be the anisotropic conductive film as set forth above.

Description of details apparent to those skilled in the art will be omitted for clarity.

Each of the anisotropic conductive films fabricated in Examples and Comparative Examples is an exemplary anisotropic conductive film used to connect a glass substrate to an IC for display panels, and has a double-layer structure of a conductive layer containing conductive particles and a dielectric layer. In an implementation, the anisotropic conductive film may have a different layer structure.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Example 1

Conductive Layer Containing Conductive Particles

A conductive layer composition was prepared by mixing 30 wt % of a biphenyl fluorene phenoxy resin (FX-293, Nippon Steel Corporation), 22.5 wt % of an alicyclic epoxy compound (Celloxide 2021P, DAICEL), 2.5 wt % of an oxetane compound (OXT-221, TOAGOSEI), 5 wt % of a quaternary ammonium catalyst (CXC-1612, KING INDUSTRY), 3 wt % of a silane compound (KBM-403, SHINETSU), 2 wt % of aluminum hydroxide ($Al(OH)_2$) (ALDRICH CHEMICALS), 10 wt % of spherical silica (Sciqas, SAKAI, average particle diameter: 0.4 μm), and 25 wt % of conductive particles subjected to insulation treatment (N2EJB, average particle diameter: 3 μm, Sekisui Co., Ltd., Japan).

The conductive layer composition was coated onto a release film and dried at 60° C. in a dryer for 5 minutes to volatilize a solvent, thereby obtaining a 6 μm thick conductive layer.

Dielectric Layer not Containing Conductive Particles

A dielectric layer composition was prepared in the same manner as in Example 1 except that the conductive particles were omitted. The dielectric layer composition was coated onto a release film and dried at 60° C. in a dryer for 5 minutes to volatilize a solvent, thereby, thereby obtaining a 12 μm thick dielectric layer.

The conductive film was laminated on the dielectric layer at a temperature of 40° C. under a pressure of 1 MPa, thereby obtaining an anisotropic conductive film (thickness: 18 μm) having a double-layer structure in which the dielectric layer was stacked on the conductive layer.

In Examples 2 to 7 and Comparative Examples 1 to 4, anisotropic conductive films (thickness: 18 μm) having a double-layer structure in which a dielectric layer was stacked on a conductive layer were prepared in a similar manner to Example 1. In each of Examples and Comparative Examples, a dielectric layer was prepared using a composition which was the same as a conductive layer composition except that conductive particles were omitted. Thus, in Examples 2 to 7 and Comparative Examples 1 to 4, only the difference between conductive layer compositions containing conductive particles will be described hereinafter.

Examples 2 to 5

Anisotropic conductive film compositions were prepared in the same manner as in Example 1 except that the alicyclic epoxy compound (Celloxide 2021P, DAICEL) and the oxetane compound (OXT-221, TOAGOSEI) were used in an amount of 25 wt % in total and a weight ratio of the alicyclic epoxy compound to the oxetane compound (9:1 in Example 1) was changed to 7:3 (Example 2), 5:5 (Example 3), 3:7 (Example 4), and 1:9 (Example 5), respectively, and anisotropic conductive films were obtained using the respective anisotropic conductive film compositions.

Example 6

An anisotropic conductive film composition was prepared in the same manner as in Example 1 except that the amounts of the alicyclic epoxy compound (Celloxide 2021P, DAICEL) and the oxetane compound (OXT-221, TOAGOSEI) were changed to 7.5 wt % and 7.5 wt %, respectively and 10 wt % of a phenol novolac epoxy compound (YDPN638, KUKDO Chemical) was used, and an anisotropic conductive film was obtained using the anisotropic conductive film composition.

Example 7

An anisotropic conductive film composition was prepared in the same manner as in Example 1 except that the amount of the quaternary ammonium catalyst (CXC-1612, KING INDUSTRY) was changed to 4.8 wt %, and 0.2 wt % of a compound represented by Formula 27-1 (SI-S, Sanshin Chemical Industry Co., Ltd., Japan) was used as a stabilizer, and an anisotropic conductive film was obtained using the anisotropic conductive film composition.

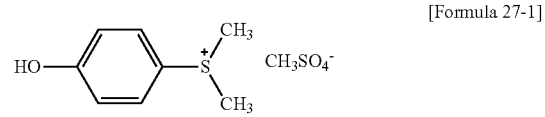

[Formula 27-1]

Comparative Example 1

An anisotropic conductive film composition was prepared in the same manner as in Example 3 except that a sulfonium cationic catalyst (San-aid SI-60L, Sanshin Chemical Industry Co., Ltd., Japan) was used instead of the quaternary ammonium catalyst, and an anisotropic conductive film was obtained using the anisotropic conductive film composition.

Comparative Example 2

An anisotropic conductive film composition was prepared in the same manner as in Example 6 except that a sulfonium cationic catalyst (San-aid SI-60L, Sanshin Chemical Industry Co., Ltd., Japan) was used instead of the quaternary ammonium catalyst, and an anisotropic conductive film was obtained using the anisotropic conductive film composition.

Comparative Example 3

An anisotropic conductive film composition was prepared in the same manner as in Example 3 except that the oxetane compound was omitted and 25 wt % of the alicyclic epoxy compound (Celloxide 2021P, DAICEL) was used alone as a curable compound, and an anisotropic conductive film was obtained using the anisotropic conductive film composition.

Comparative Example 4

An anisotropic conductive film composition was prepared in the same manner as in Example 3 except that the alicyclic epoxy compound was omitted and 25 wt % of the oxetane compound (OXT-221, TOAGOSEI) was used alone as a curable compound, and an anisotropic conductive film was obtained using the anisotropic conductive film composition.

Details of each of the components used in Examples and Comparative Examples are shown in Table 1.

TABLE 1

|  | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 |
|---|---|---|---|---|---|---|---|---|---|---|---|
| Binder (wt %) | 30 | 30 | 30 | 30 | 30 | 30 | 30 | 30 | 30 | 30 | 30 |
| Alicyclic epoxy (wt %) | 22.5 | 17.5 | 12.5 | 7.5 | 2.5 | 7.5 | 12.5 | 12.5 | 7.5 | 25 | — |
| Oxetane compound (wt %) | 2.5 | 7.5 | 12.5 | 17.5 | 22.5 | 7.5 | 12.5 | 12.5 | 7.5 | — | 25 |
| Phenol novolac epoxy (wt %) | — | — | — | — | — | 10 | — | — | 10 | — | — |

TABLE 1-continued

| | | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 |
|---|---|---|---|---|---|---|---|---|---|---|---|---|
| Curing catalyst (wt %) | Quaternary ammonium | 5 | 5 | 5 | 5 | 5 | 5 | 4.8 | — | — | 5 | 5 |
| | Sulfonium | — | — | — | — | — | — | — | 5 | 5 | — | — |
| Inorganic filler (wt %) | Aluminum hydroxide | 2 | 2 | 2 | 2 | 2 | 2 | 2 | 2 | 2 | 2 | 2 |
| | Silica | 10 | 10 | 10 | 10 | 10 | 10 | 10 | 10 | 10 | 10 | 10 |
| Conductive particles (wt %) | | 25 | 25 | 25 | 25 | 25 | 25 | 25 | 25 | 25 | 25 | 25 |
| Silane compound (wt %) | | 3 | 3 | 3 | 3 | 3 | 3 | 3 | 3 | 3 | 3 | 3 |
| Stabilizer (wt %) | | — | — | — | — | — | — | 0.2 | — | — | — | — |
| | | 100 | 100 | 100 | 100 | 100 | 100 | 100 | 100 | 100 | 100 | 100 |

Experimental Example 1: Calculation of DSC Heat Quantity Variation Rate of Anisotropic Conductive Film Each of the anisotropic conductive films prepared in Examples 1 to 6 and Comparative Examples 1 to 4 was sampled in an amount of 1 mg, and initial heat quantity ($H_0$) and heat quantity ($H_1$) after leaving the sample at 40° C. for 24 hours were found by measuring calories of the film sample while heating the sample in a temperature range of −50° C. to 250° C. at a heating rate of 10° C./min using a DSC (differential scanning calorimeter) (Q20, TA Instruments) under a nitrogen atmosphere, followed by calculation of a heat quantity variation rate of the anisotropic conductive film according to the following Equation 1.

$$\text{Heat quantity variation rate (\%)} = [(H_0 - H_1)/H_0] \times 100 \quad (1)$$

Experimental Example 2: Measurement of Exothermic Onset Temperature and Exothermic Peak Temperature on DSC DSC exothermic onset temperature and exothermic peak temperature of each of the anisotropic conductive films prepared in Examples 1 to 6 and Comparative Examples 1 to 4 were measured using a differential scanning calorimeter (DSC) (Q20, TA Instruments) while heating the anisotropic conductive film in a temperature range of −50° C. to 250° C. at a heating rate of 10° C./min under a nitrogen atmosphere. On a DSC graph, the DSC exothermic onset temperature is defined as a temperature at a point at which a base line between a heat generation onset point and a heat generation finish point meets a tangential line from the highest peak to a point at which the slope of the DSC graph starts to increase due to heat generation upon DSC measurement. The DSC exothermic peak temperature is defined as a temperature at the highest peak of heat quantity on the DSC graph.

Experimental Example 3: Measurement of Initial Indentation Uniformity and Post-Reliability Indentation Uniformity Each of the anisotropic conductive films prepared in Examples and Comparative Examples was placed on a glass substrate including an ITO circuit having a bump area of 1,200 μm² and a thickness of 2,000 Å (Neoview Kolon, Inc.), and subjected to preliminary compression at 70° C. under 1 MPa for 1 second. Then, after removal of a release film, an IC chip having a bump area of 1,200 μm² and a thickness of 1.5 T (Samsung LSI) was placed on the anisotropic conductive film, followed by main compression at 130° C. under 70 MPa for 5 seconds. Then, uniformity of indentations was observed with the naked eye.

In addition, the specimen was left in a high temperature and high humidity chamber at 85° C. and 85% RH for 500 hours, followed by observing uniformity of indentations with the naked eye for evaluation of reliability.

Specifically, whether an indentation at both sides of the IC chip was as clear as an indentation in a central region thereof was checked. When the indentations were uniform and an indentation on a first row of output terminals was as clear as an indentation on a second row of output terminals, this result was scored as 5, and when the indentation at both sides of the IC chip were very unclear or unrecognizable as compared with the indentation in the central region thereof, this result was scored as 0. Each criterion was scored on a scale of 0 to 5.

Experimental Example 4: Measurement of Initial Connection Resistance and Post-Reliability Connection Resistance Each of the anisotropic conductive films prepared in Examples and Comparative Examples was placed on a glass substrate including an ITO circuit having a bump area of 1,200 μm² and a thickness of 2,000 Å, and subjected to preliminary compression at 70° C. and 1.0 MPa for 1 second. Then, after removal of a release film, an IC chip having a bump area of 1,200 μm² and a height of 15 μm was placed on the anisotropic conductive film, followed by main compression at 130° C. under 70 MPa for 5 seconds, thereby preparing 5 specimens.

Resistance values between 4 points of each of the prepared specimens were measured using a resistance meter with 4 probes by the 4-point probe method. Here, the resistance values were calculated based on voltages measured upon application of a current of 1 mA by the resistance meter, and averaged.

First, the initial connection ($T_0$) resistance of the specimen was measured.

Then, the specimen was placed in a high temperature and high humidity chamber at 85° C. and 85% RH for 500 hours, followed by measurement of resistance in the same manner, thereby finding a connection resistance ($T_1$) after reliability testing.

Results of Experimental Examples 1 to 4 are shown in Table 2.

TABLE 2

|  | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 |
|---|---|---|---|---|---|---|---|---|---|---|---|
| Initial indentation | 5 | 5 | 5 | 5 | 5 | 5 | 5 | 5 | 5 | 4 | 5 |
| Post-reliability indentation | 3 | 4 | 4 | 4 | 4 | 3 | 4 | 3 | 3 | 1 | 0 |
| Initial connection resistance ($T_0$) ($\Omega$) | 0.1 | 0.1 | 0.1 | 0.1 | 0.1 | 0.1 | 0.1 | 0.1 | 0.1 | 0.2 | 0.3 |
| Post-reliability connection resistance ($T_1$) ($\Omega$) | 0.4 | 0.3 | 0.3 | 0.3 | 0.3 | 0.4 | 0.4 | 0.3 | 0.3 | 2.0 | 4.0 |
| Exothermic onset temperature (° C.) | 83 | 80 | 76 | 79 | 84 | 79 | 84 | 70 | 72 | 91 | 90 |
| Exothermic peak temperature (° C.) | 103 | 100 | 96 | 99 | 104 | 99 | 103 | 87 | 90 | 110 | 109 |
| Heat quantity variation rate | 6 | 7 | 8 | 7 | 6 | 7 | 7 | 20 | 17 | 4 | 5 |

As shown in Table 2, it may be seen that the anisotropic conductive films of Examples 1 to 6 (including the alicyclic epoxy compound, the oxetane compound, and the quaternary ammonium catalyst) had a low heat quantity variation rate and thus high storage stability, exhibited a low DSC exothermic onset temperature and a low DSC exothermic peak temperature, and provided a relatively small difference therebetween, thereby enabling rapid curing at low temperature. In addition, the anisotropic conductive films of Examples 1 to 6 exhibited good properties in terms of indentation and connection resistance after reliability testing.

By way of summation and review, there is increasing demand for a thinner glass substrate due to thickness reduction of display panels. When a drive IC is mounted on a glass substrate via an anisotropic conductive film, the glass substrate could suffer from warpage during heating and compression. Warpage of the glass substrate my cause light leakage, thereby causing failure of a display. A thinner glass substrate may suffer from more severe warpage and may result in a higher failure rate.

In order to help reduce or prevent warpage of the glass substrate, an anisotropic conductive film may be rapidly cured at a low temperature of 150° C. or less within 5 seconds or less. Although a curable compound and a curing agent having high reactivity may be used, use of the curing compound and the curing agent could cause deterioration in storage stability due to high reactivity thereof and may require an excess of a stabilizer. Some anisotropic conductive films may employ an alicyclic epoxy compound and oxetane compound as curable compounds and a sulfonium-based latent cationic catalyst having a particular structure. However, such an anisotropic conductive film may exhibit low storage stability due to high reactivity between the alicyclic epoxy compound, the oxetane compound, and the sulfonium-based cationic catalyst.

An anisotropic conductive film may be rapidly cured at a temperature of 150° C. or less while exhibiting excellent storage stability.

The embodiments may provide an anisotropic conductive film composition which can achieve rapid curing at low temperature while exhibiting excellent storage stability and reliability.

According to an embodiment, it is possible to provide an anisotropic conductive film composition or an anisotropic conductive film which uses an alicyclic epoxy compound and an oxetane compound as curable compounds and uses a quaternary ammonium catalyst, thereby achieve rapid curing at low temperature while exhibiting excellent storage stability and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

LIST OF REFERENCE NUMERALS

3: Conductive particles
10: Anisotropic conductive film
30: Connection structure
50 First connection member
60: Second connection member
70: First electrode
80 Second electrode

What is claimed is:
1. An anisotropic conductive film, comprising:
a binder resin;
a curable alicyclic epoxy compound;
a curable oxetane compound;
a quaternary ammonium catalyst;
an inorganic filler; and
conductive particles,
wherein the anisotropic conductive film has a heat quantity variation rate of about 15% or less, as measured by differential scanning calorimetry (DSC) and calculated by Equation 1:

Heat quantity variation rate (%)=$[(H_0-H_1)/H_0] \times 100$,   Equation 1 wherein $H_0$ is a DSC heat quantity of the anisotropic conductive film, as measured at 25° C. and a time point of 0 hr, and $H_1$ is a DSC heat quantity of the anisotropic conductive film, as measured after being left at 40° C. for 24 hours,
wherein a weight ratio of the alicyclic epoxy compound to the oxetane compound is about 1:9 to about 9:1, and
wherein the anisotropic conductive film includes:
about 20 wt % to 60 wt % of the binder resin;
a total of about 10 wt % to about 40 wt % of the curable alicyclic epoxy compound and the curable oxetane compound;
about 1 wt % to about 10 wt % of the quaternary ammonium catalyst;
about 5 wt % to about 30 wt % of the inorganic filler; and
about 1 wt % to about 20 wt % of the conductive particles, based on a total weight of the anisotropic conductive film in terms of solid content.

2. The anisotropic conductive film as claimed in claim 1, wherein the alicyclic epoxy compound is represented by one of Formulae 1 to 4:

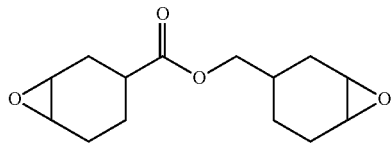

Formula 1

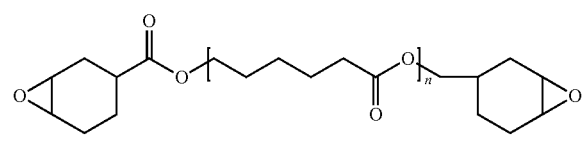

Formula 2

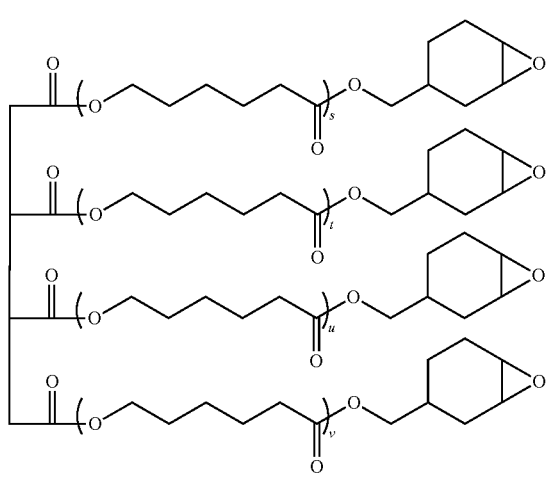

Formula 3

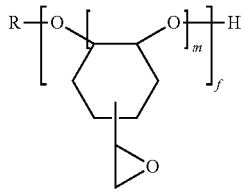

Formula 4 wherein, in Formulae 2 to 4,
n, s, t, u, v, m, and f are each independently an integer of 1 to 50, and R is an alkyl group, an acetyl group, an alkoxy group, or a carbonyl group.

3. The anisotropic conductive film as claimed in claim 1, wherein the oxetane compound is a carbon polymer compound containing 1 to 4 oxetane rings per molecule.

4. The anisotropic conductive film as claimed in claim 1, wherein the quaternary ammonium catalyst is represented by Formula 26:

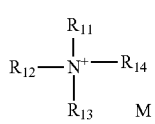

Formula 26 wherein, in Formula 26,
$R_{11}$, $R_{12}$, $R_{13}$ and $R_{14}$ are each independently a substituted or unsubstituted $C_1$ to $C_6$ alkyl group or a substituted or unsubstituted $C_6$ to $C_{20}$ aryl group, and
M is $Cl^-$, $BF_4^-$, $PF_6^-$, $N(CF_3SO_2)_2^-$, $CH_3CO_2^-$, $CF_3CO_2^-$, $CF_3SO_3^-$, $HSO_4^-$, $SO_4^{2-}$, $SbF_6^-$, or $B(C_6F_5)_4^-$.

5. The anisotropic conductive film as claimed in claim 4, wherein M is $SbF_6^-$ or $B(C_6F_5)_4^-$.

6. The anisotropic conductive film as claimed in claim 1, wherein the binder resin includes a polyimide resin, a polyamide resin, a phenoxy resin, a polymethacrylate resin, a polyacrylate resin, a polyurethane resin, a polyester resin, a polyester urethane resin, a polyvinyl butyral resin, a styrene-butadiene-styrene (SBS) resin or an epoxylated compound thereof, a styrene-ethylene/butylene-styrene (SEBS) resin or a modified compound thereof, an acrylonitrile butadiene rubber (NBR) or a hydrogenated compound thereof, or a combination thereof.

7. The anisotropic conductive film as claimed in claim 6, wherein the binder resin includes the phenoxy resin, the phenoxy resin including a fluorene phenoxy resin.

8. The anisotropic conductive film as claimed in claim 1, wherein the inorganic filler includes alumina, silica, titania, zirconia, magnesia, ceria, zinc oxide, iron oxide, silicon nitride, titanium nitride, boron nitride, calcium carbonate, aluminum sulfate, aluminum hydroxide, calcium titanate, talc, calcium silicate, or magnesium silicate.

9. The anisotropic conductive film as claimed in claim 1, further comprising a stabilizer in an amount of greater than 0 wt % to less than 5 wt %, based on a total weight of the anisotropic conductive film in terms of solid content.

10. The anisotropic conductive film as claimed in claim 1, further comprising a curable epoxy group-containing silsesquioxane compound, a curable oxetane group-containing silsesquioxane compound, a curable phenol novolac epoxy resin, or a curable cresol novolac epoxy resin.

11. The anisotropic conductive film as claimed in claim 1, wherein the anisotropic conductive film has a DSC exothermic onset temperature of about 70° C. to about 85° C. and a DSC exothermic peak temperature of about 90° C. to about 110° C.

12. The anisotropic conductive film as claimed in claim 1, wherein the anisotropic conductive film has a post-reliability connection resistance of about 0.5Ω or less, as measured after preliminary compression at a temperature of 50° C. to 90° C. under a pressure of 0.5 MPa to 2 MPa for 0.5 to 2 seconds and main compression at a temperature of 100° C. to 150° C. under a pressure of 50 MPa to 90 MPa for 4 to 7 seconds, followed by leaving the film at 85° C. and 85% RH for 500 hours.

13. A connection structure, comprising:
a first connection member that includes a first electrode;
a second connection member that includes a second electrode; and
an anisotropic conductive film between the first connection member and the second connection member to connect the first electrode to the second electrode, wherein the anisotropic conductive film is the anisotropic conductive film as claimed in claim 1.

14. An anisotropic conductive film composition, comprising:
a binder resin;
a curable alicyclic epoxy compound;
a curable oxetane compound;
a quaternary ammonium catalyst;
an inorganic filler; and
conductive particles,
wherein a weight ratio of the alicyclic epoxy compound to the oxetane compound is about 1:9 to about 9:1, and
wherein the anisotropic conductive film includes:
about 20 wt % to 60 wt % of the binder resin;
a total of about 10 wt % to about 40 wt % of the curable alicyclic epoxy compound and the curable oxetane compound;
about 1 wt % to about 10 wt % of the quaternary ammonium catalyst;
about 5 wt % to about 30 wt % of the inorganic filler; and
about 1 wt % to about 20 wt % of the conductive particles, based on a total weight of the anisotropic conductive film in terms of solid content.

15. A connection structure, comprising:
a first connection member that includes a first electrode;
a second connection member that includes a second electrode; and
an anisotropic conductive film between the first connection member and the second connection member to connect the first electrode to the second electrode, wherein the anisotropic conductive film is prepared using the anisotropic conductive film composition as claimed in claim 14.

* * * * *